US008675379B2

(12) United States Patent
Smolenski et al.

(10) Patent No.: US 8,675,379 B2
(45) Date of Patent: Mar. 18, 2014

(54) POWER CONVERTING APPARATUS HAVING IMPROVED ELECTRO-THERMAL CHARACTERISTICS

(75) Inventors: Joseph Lucian Smolenski, Niskayuna, NY (US); Michael Schutten, Niskayuna, NY (US); Eladio Clemente Delgado, Niskayuna, NY (US); Richard Alfred Beaupre, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 295 days.

(21) Appl. No.: 13/204,834

(22) Filed: Aug. 8, 2011

(65) Prior Publication Data
US 2013/0039103 A1   Feb. 14, 2013

(51) Int. Cl.
*H05K 7/20*   (2006.01)
*H02M 7/5387*   (2007.01)

(52) U.S. Cl.
USPC ........................... 363/132; 363/141; 363/144

(58) Field of Classification Search
USPC .................................. 363/98, 132, 141, 144
See application file for complete search history.

(56) References Cited

U.S. PATENT DOCUMENTS

| | | | |
|---|---|---|---|
| 5,179,362 A | 1/1993 | Okochi et al. | |
| 6,636,429 B2 | 10/2003 | Maly et al. | |
| 6,906,404 B2 | 6/2005 | Maly et al. | |
| 7,327,024 B2 | 2/2008 | Stevanovic et al. | |
| 7,675,729 B2 | 3/2010 | Anthony et al. | |
| 2003/0133319 A1* | 7/2003 | Radosevich et al. | 363/141 |
| 2007/0002594 A1* | 1/2007 | Otsuka et al. | 363/37 |
| 2008/0246459 A1 | 10/2008 | Ingman | |
| 2011/0101515 A1 | 5/2011 | Beaupre et al. | |

OTHER PUBLICATIONS

Milind M. Jha, Kunj Behari Naik and Shyama P. Das, Selecting Proper Connection Points for Y-capacitor to Reduce EMI in SMPS, ARPN Journal of Engineering and Applied Sciences, pp. 46-51, vol. 5, Issue 2, Feb. 2010.

High-temperature, Wideband Gap Materials for High-power Electrical Power Conditioning, Combat Hybrid Power System Component Technologies: Technical Challenges and Research Priorities (2002), pp. 31-40.

* cited by examiner

*Primary Examiner* — Gary L Laxton
(74) *Attorney, Agent, or Firm* — Scott J. Asmus

(57) ABSTRACT

A power-converting apparatus, such as a power module, may include a base plate (16), a first direct current (DC) bus and a second DC bus (22, 24). A power semiconductor component (18, 20) may be electrically coupled to one of the buses, and may be disposed on a substrate (12, 14) physically coupled to the base plate. The power semiconductor component may be made from a high-temperature, wide bandgap material, and the substrate may be exposed to a heat flux based on an operational temperature of the power semiconductor component. At least a first capacitor (50) may be coupled across the first and second DC buses, and at least second and third capacitors (52) may be respectively coupled across respective ones of the first and second buses and an alternating current (AC) return path. Capacitors (50, 52) may each be located inside the power module to establish circuit connections sufficiently proximate to the first power semiconductor component to reduce a formation of parasitic inductances, and further may each be located physically apart from the substrate and thus not exposed to the heat flux.

10 Claims, 5 Drawing Sheets

POWER CONVERTING APPARATUS HAVING IMPROVED ELECTRO-THERMAL CHARACTERISTICS

FIELD

Embodiments presented herein generally relate to power modules, and, more particularly, to power modules having improved electro-thermal characteristics.

BACKGROUND

Power semiconductor modules, or power modules, are used for various electrical power conversion applications. Example conversion applications may include, inversion applications for converting direct current (DC) power to alternating current (AC) power, rectification applications for converting AC to DC power, voltage conversion applications for converting DC power from one voltage to another, and frequency conversion applications for converting AC power from one oscillation frequency to another. One common operation that may be used in any of the foregoing power conversions may involve a controlled switching of one or more power switching devices between a conductive and a non-conductive state.

As the power switching devices in the module may be operated at relatively fast switching speeds, inductance due to the configuration of the circuit ("parasitic inductance") can lead to increased power losses resulting from greater voltage and current oscillation and reduced reliability due to greater overvoltage stresses endured by the power switches.

To reduce the detrimental effects associated with the switching action of the module, relatively large capacitors may be externally located across the positive and negative DC buses or from each DC bus to an electrical return. These capacitors are commonly referred to in the art as "X" (across the power bus) or "Y" capacitors (from a given power bus to the electrical return). By "externally" it is meant that the elements referred to are located outside the power module. Unfortunately, the relatively long length of the electrical leads for connecting such external connectors and inductance associated with these leads make this approach somewhat ineffective.

In view of the foregoing considerations, it would be desirable to provide further improvements to power modules.

BRIEF DESCRIPTION

In one example embodiment, a power-converting apparatus may include a base plate, a first direct current (DC) bus and a second DC bus. A power semiconductor component may be electrically coupled to one of the buses, and may be disposed on a first substrate physically coupled to the base plate. The power semiconductor component may comprise a high-temperature, wide bandgap material, and the substrate may be exposed to a heat flux based on an operational temperature of the power semiconductor component. At least a first capacitor may be coupled across the first and second DC buses, and at least second and third capacitors may be respectively coupled across respective ones of the first and second buses and an alternating current (AC) return path. The capacitors may each be located inside the power module to establish circuit connections sufficiently proximate to the first power semiconductor component to reduce a formation of parasitic inductances, and further may each be located physically apart from the substrate and thus not exposed to the heat flux.

In another example embodiment, a power-converting apparatus may include a base plate, a first direct current (DC) bus and a second DC bus. A first power semiconductor component may be electrically coupled to one of the buses. A second power semiconductor component may be electrically coupled to the other one of the buses. The first and second power semiconductor components may be disposed on a substrate physically coupled to the base plate. The first and second power semiconductor may comprise a respective high-temperature, wide bandgap material. The substrate may be subject to a heat flux based on respective operational temperatures of the first and second power semiconductor components. At least a first capacitor may be coupled across the first and second DC buses, and at least second and third capacitors may be respectively coupled across respective ones of the first and second buses and an electrical ground. The capacitors may each be located inside the power module to establish circuit connections sufficiently proximate to the first and second power semiconductor components to reduce a formation of parasitic inductances, and further may each be located physically apart from the substrate and thereby not subject to the heat flux.

DRAWINGS

Figure 3:
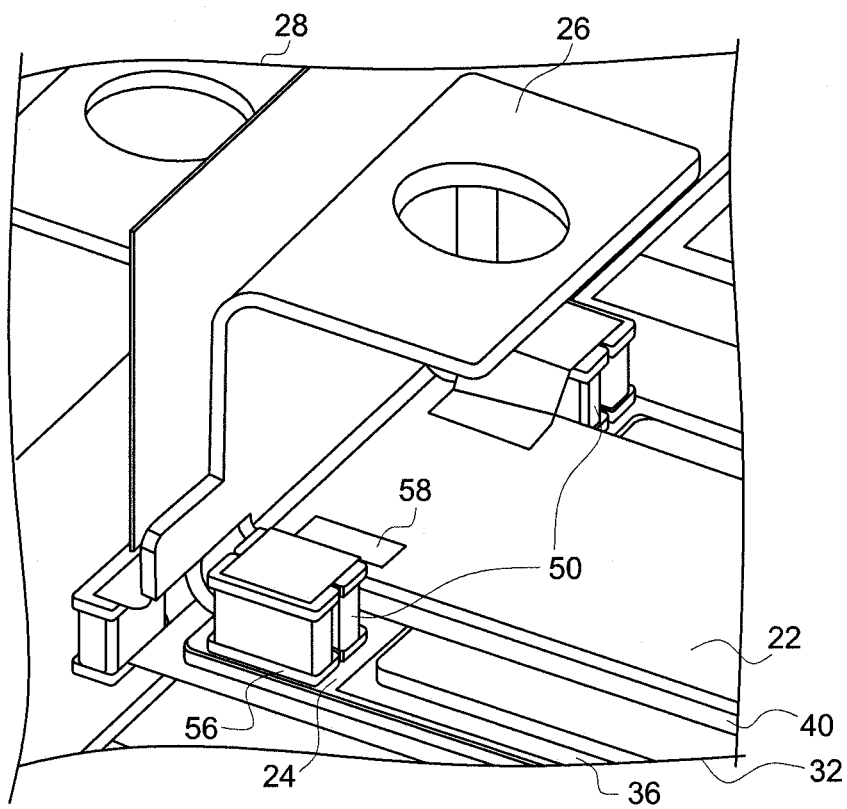
Figure 4:
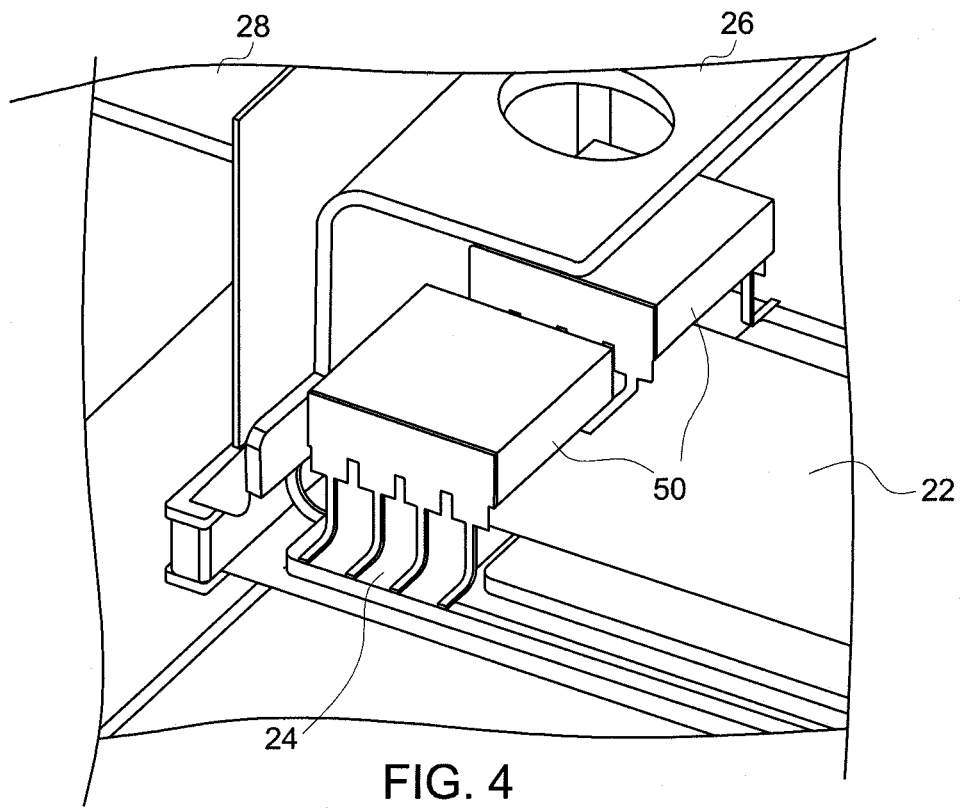

FIGS. 3 and 4 respectively show zoomed-in views of example interconnections for the X capacitors in example locations inside the power module but spaced apart from a substrate subject to high thermal flux in accordance with example embodiments.

Figure 5:
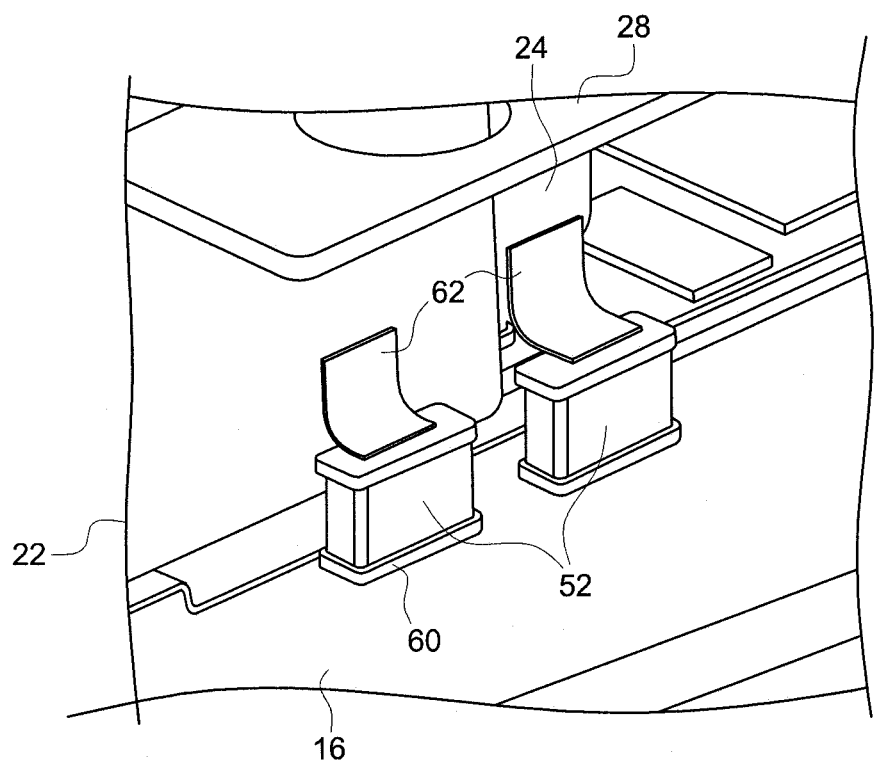
Figure 6:
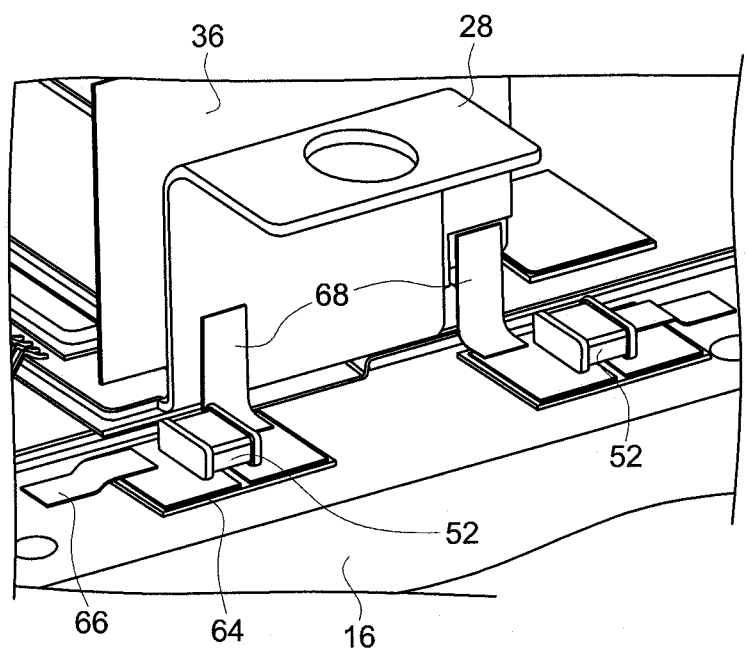

FIGS. 5 and 6 respectively show zoomed-in views of example interconnections for the Y capacitors in accordance with example embodiments.

Figure 7:
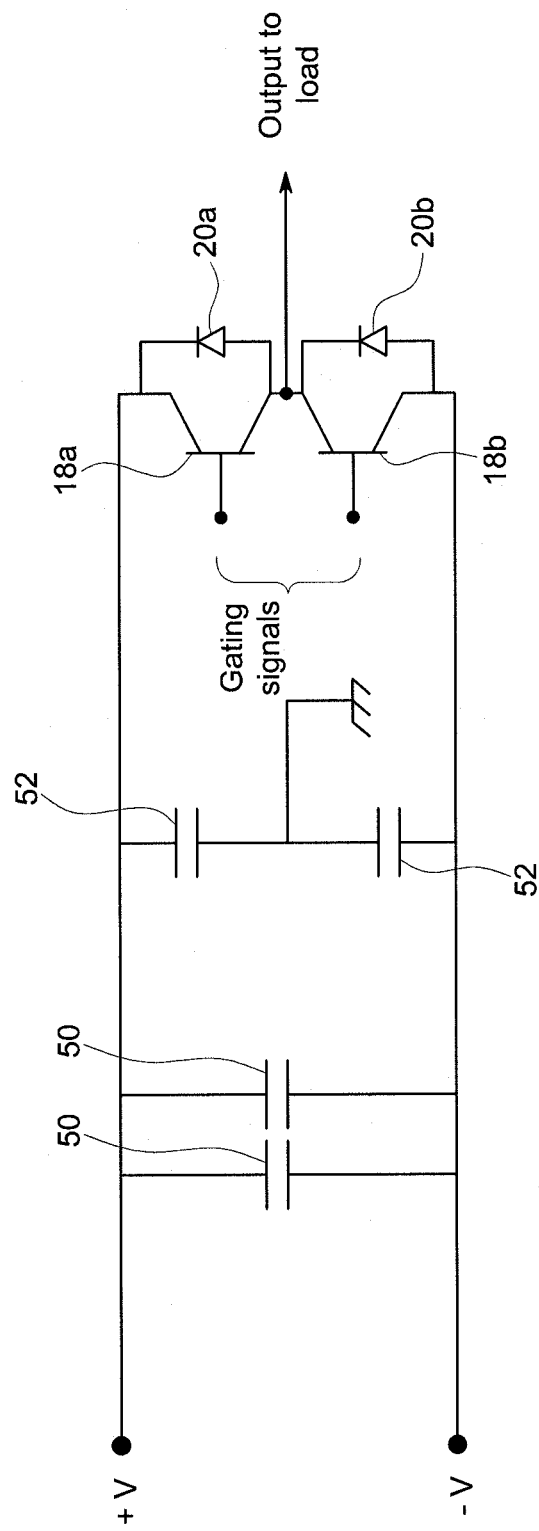

FIG. 7 is an example circuit schematic of a power module in accordance with an example embodiment.

DETAILED DESCRIPTION

Figure 1:
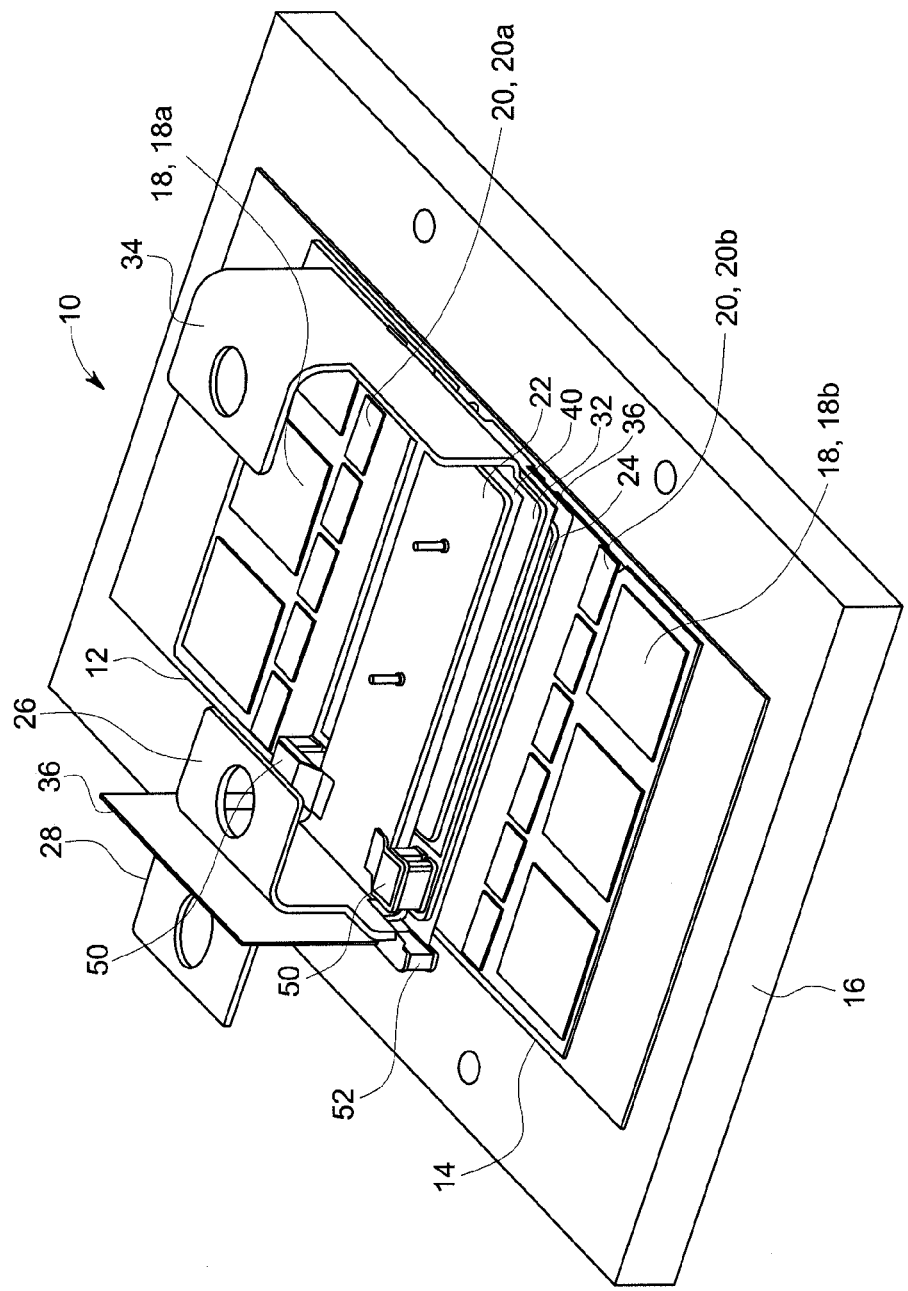
FIG. 1 is a perspective view of a power module.
Figure 2:
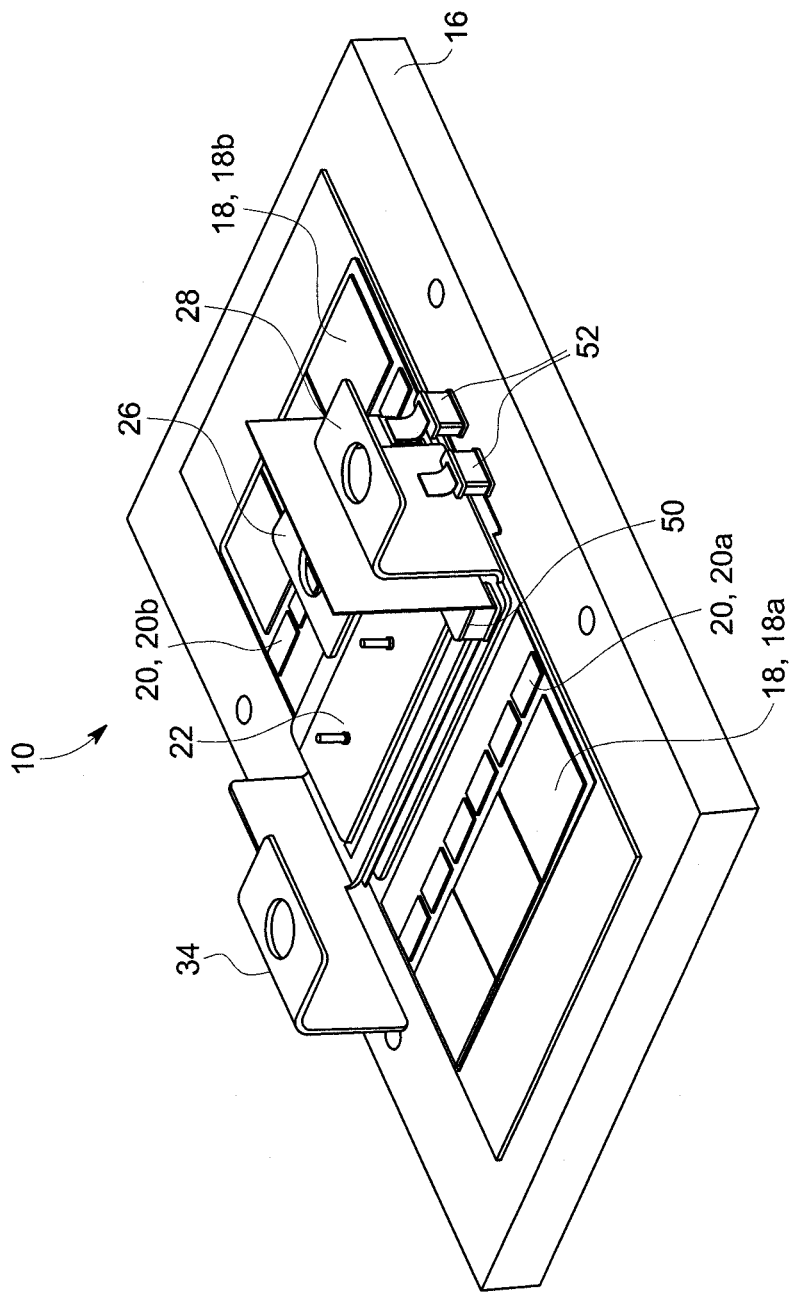
FIG. 2 is another perspective view of the power module shown in FIG. 1.

FIGS. 1 and 2 respectively show an example embodiment of a power module 10. The power module 10 may include a substrate, such as may be made up of a first substrate 12 and a second substrate 14. For example, each of the first and second substrates 12, 14 may include a respective patterned copper layer, which layers can be disposed on respective ceramic tiles to form parts of respective power electronic substrates, such as a direct bonded copper substrate. The first and second substrates 12, 14 (and generally any associated portions of direct bonded copper substrates within which the substrates may be integrated) may be physically coupled to a base plate 16, which in one example embodiment may be substantially planar.

The module 10 may include a plurality of power semiconductor components. For example, the module 10 may include one or more power switches 18 and one or more diodes 20. In accordance with aspects of the present invention, the power semiconductor components is formed of a respective high-temperature, wide bandgap semiconductor material, such as silicon carbide, gallium nitride and aluminum nitride. A first set of power switches 18a and diodes 20a (e.g., upper switch structure) may be physically coupled to the first substrate 12, while a second set of power switches 18b and diodes 20b (e.g., lower switch structure) can be physically coupled to the second conductive substrate 14. It will be appreciated that the high-temperature power semiconductor components may operate at relatively higher temperatures (e.g., junction temperature>175° C.) than the operational temperatures of standard Si-based power semiconductors. Accordingly, first and second substrates 12, 14 may be exposed to a relatively high heat flux based on the higher operational temperatures of the high-temperature power semiconductor components.

Referring again to FIGS. 1 and 2, the module 10 can also include a first busbar 22 and a second busbar 24, which may be electrically coupled by respective flanges 26, 28 to positive and negative ports of a DC power source (not shown), to form respective DC power buses. As will be appreciated by one skilled in the art, the "positive" and "negative" ports and/or busbars are expected, in operation, to be at different electric potentials relative to one another, but are not restricted to a specific polarity. A DC bus insulation layer 36 may be interposed between first and second busbars 22, 24.

Power module 10 may further include an output terminal 32, which output terminal may be configured to couple to an electrical load (not shown) to which electrical power is provided by the module 10. For example, output terminal 32 may include a flange 34 to which a port of the electrical load may be physically bolted. An output insulation layer 40 may be interposed between DC busbars 22, 24 and output terminal 32. It will be appreciated by one skilled in the art that aspects of the present invention are not limited to any specific physical arrangement of busbars 22, 24 and output terminal 32. Accordingly, the physical arrangement shown in FIGS. 1 and 2 should be construed in an example sense and not in a limiting sense.

Embodiments consistent with the above description may be conducive to improving the electro-thermal characteristics of the power module 10. Although the configuration of power module 10 may be effective to reduce the formation of parasitic inductance, it has been recognized that power module 10 may further benefit from so called "X" and "Y" capacitors. For readers desirous of general background information in connection with aspects conducive to a reduction of parasitic inductance in a power module, reference is made to U.S. patent application Ser. No. 12/609,400, titled "Power Module Assembly With Reduced Inductance", which is commonly assigned to the assignee of the present invention and is herein incorporated by reference in its entirety.

The electrical benefits, such as overvoltage reduction, EMI reduction, etc., may generally be provided by the "X" and "Y" capacitors. Embodiments presented herein may appropriately configure the power module to accommodate inside the power module high-temperature power semiconductors capable of operating at relatively high-temperatures with capacitors capable of operating at lower operating temperatures.

In accordance with example embodiments, one or more capacitors 50 (e.g., X capacitors) may be coupled across first and second busbars 22, 24 (e.g., first and second DC buses). Also one or more capacitors 52 (e.g., Y capacitors) may be respectively coupled across respective ones of the first and second buses and an alternating current (AC) return path, e.g., ground, chassis, isolated system ground, etc.

In accordance with example embodiments, capacitors 50, 52 may each be located inside the power module to establish circuit connections sufficiently proximate to the power semiconductor components to reduce the formation of parasitic inductances. Additionally, capacitors 50, 52 may each be located physically apart from substrates 12 and 14, for example, and thereby not exposed to the heat flux resulting from the high-temperature power semiconductors.

FIGS. 3 and 4 respectively show zoomed-in views of example interconnections for the X capacitors. FIG. 3 illustrates an example embodiment where a first electrical interface for capacitors 50 may be a surface-mounted interface 56 on one of the first and second busbars 22, 24 and a second electrical interface for capacitors 50 may be established by way of an electrically conductive strap 58 to the other one of the first and second busbars. FIG. 4 illustrates an example embodiment where capacitors 50 may include a multi-legged interface for effecting the electrical interface across the first and second busbars 22, 24.

FIGS. 5 and 6 respectively show zoomed-in views of example interconnections for capacitors 52 (e.g., Y capacitors). FIG. 5 illustrates an example embodiment where a first electrical interface for capacitors 52 may be a surface-mounted interface 60 on the base plate 16 and a respective second electrical interface may be established by way of an electrically conductive strap 62 to one of the first and second bars 22, 24. In this example embodiment, base plate 16 constitutes the AC return path.

FIG. 6 illustrates an example embodiment where respective electrical interfaces for capacitors 52 may be effected by way of an interface substrate 64 (e.g., a direct bond copper substrate, an active metal braze substrate, etc.) In accordance with example embodiments, interface substrate 64 may be configured to accommodate thermally-induced stress between a respective capacitor 52 and the base plate 16. For example, a first electrical strap 66 may establish an electrical connection from base plate 16 and through a first section of the interface substrate 64 to a respective first terminal of capacitors 62. A second electrical strap 68 may establish an electrical connection from one of the first and second busbars 22, 24 through a second section of the interface substrate 64 to a respective second terminal of capacitors 62. In this example embodiment, base plate 16 similarly constitutes the AC return path.

FIG. 7 is an example circuit schematic of a power module configured in accordance with an example embodiment. In operation, the upper switching structure (high-temperature power switch 18a and diode 20a) coupled to the first DC bus (labeled +V) and the lower switching structure (high-temperature power switch 18b and diode 20b) coupled to the second DC bus (labeled −V) may be electrically coupled to one another and selectively actuated in response to appropriately controlled gating signals to function as an inverter phase leg, for example.

It will be appreciated embodiments consistent with the above description may effectively accommodate X and Y capacitors inside the power module in close proximity to high-temperature power semiconductor components without causing such capacitors to be exposed to the high thermal flux that can result during the operation of such high-temperature components. Thus, the power module may advantageously achieve the benefits from the inclusion of the X and Y capacitors and further achieve the benefits associated with the inclusion of high-temperature power semiconductor components without compromising the reliability of components (i.e., X, Y capacitors) having a relatively lower thermal capability.

By way of contrast, U.S. Pat. No. 6,636,429 describes a power module architecture involving use of X and Y capacitors integrated inside the module at the substrate level. From a thermal point of view, this architecture may be limited to power switches that operate at relatively low operational temperatures, such as insulated gate bipolar transistor ("IGBT") and similar power semiconductors. More specifically, it is believed such an architecture would be ineffective for power switches operating at relatively high operational temperatures, such as power switches made up of high-temperature, wide bandgap semiconductor materials. The resulting heat flux from the high-temperature power semiconductors would likely overwhelm the capacitors integrated on the same substrate as the high-temperature power semiconductors.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power-converting apparatus comprising:
a base plate;
a first direct current (DC) bus and a second DC bus;
a first power semiconductor component electrically coupled directly to one of said buses, the first power semiconductor component disposed on a first substrate physically coupled to the base plate, wherein the first power semiconductor component is the only power semiconductor component disposed on the first substrate and comprises a high-temperature, wide bandgap material, wherein the substrate is exposed to a heat flux based on an operational temperature of the first power semiconductor component;
at least a first capacitor coupled across the first and second DC buses;
at least second and third capacitors respectively coupled across respective ones of said first and second buses and an alternating current (AC) return path, wherein said at least first, second and third capacitors is each located inside the power-converting apparatus to establish circuit connections sufficiently proximate to the first power semiconductor component to reduce a formation of parasitic inductances, and further wherein said at least first, second and third capacitors is each located physically apart from the substrate and thereby not exposed to said heat flux; and
a second power semiconductor component electrically coupled directly to the other of said buses, the second power semiconductor component disposed on a second substrate physically coupled to the base plate, wherein the second power semiconductor component is the only power semiconductor component disposed on the second substrate and comprises a high-temperature, wide bandgap material, wherein the second substrate is exposed to a heat flux based on an operational temperature of the second power semiconductor component, and further wherein said at least first, second and third capacitors is each located physically apart from the second substrate, and further wherein all power semiconductor components disposed on the first and second substrates together form only one single-phase leg of the power-converting apparatus.

2. The power-converting apparatus of claim 1, wherein the operational temperature of the first power semiconductor component is higher relative to respective operational temperatures of said capacitors.

3. The power-converting apparatus of claim 1, wherein said first DC bus comprises a first busbar and said second DC bus comprises a second busbar, wherein said at least first capacitor has a first electrical interface surface-mounted on one of said first and second busbars and a second electrical interface connected by way of an electrically conductive strap to the other one of said first and second busbars.

4. The power-converting apparatus of claim 3, wherein said at least second and third capacitors have a respective first electrical interface surface-mounted on the base plate and a respective second electrical interface connected by way of an electrically conductive strap to the respective ones of said first and second busbars, wherein the base plate constitutes the AC return path.

5. The power-converting apparatus of claim 3, further comprising an interface substrate arranged to provide respective electrical interconnections to said at least second and third capacitors between the base plate and the respective ones of said first and second busbars, wherein the interface substrate is configured to accommodate thermally-induced stress between said at least second and third capacitors and the base plate, wherein the base plate constitutes the electrical AC return path.

6. The power-converting apparatus of claim 5, wherein the interface substrate is selected from the group consisting of a direct bond copper substrate and an active metal braze substrate.

7. The power-converting apparatus of claim 1, wherein the first and second power semiconductor components comprise first and second power switches electrically coupled to one another and selectively actuated to function as an inverter phase-leg.

8. The power-converting apparatus of claim 7, further comprising respective diodes electrically connected in an anti-parallel circuit across each of the power switches.

9. The power-converting apparatus of claim 8, wherein the respective diodes and the power switches comprise silicon carbide components.

10. The power-converting apparatus of claim 1, wherein the respective high-temperature, wide bandgap material of the first and second power semiconductor components is selected from the group consisting of silicon carbide, gallium nitride and aluminum nitride.

* * * * *